(12) United States Patent
Schroder et al.

(10) Patent No.: US 9,006,047 B2
(45) Date of Patent: Apr. 14, 2015

(54) METHOD FOR PROVIDING LATERAL THERMAL PROCESSING OF THIN FILMS ON LOW-TEMPERATURE SUBSTRATES

(71) Applicant: NCC Nano, LLC, Dallas, TX (US)

(72) Inventors: Kurt A. Schroder, Coupland, TX (US); Robert P. Wenz, Austin, TX (US)

(73) Assignee: NCC Nano, LLC, Dallas, TX (US)

( * ) Notice: Subject to any disclaimer, the term of this patent is extended or adjusted under 35 U.S.C. 154(b) by 0 days.

(21) Appl. No.: 14/024,243

(22) Filed: Sep. 11, 2013

(65) Prior Publication Data

US 2014/0017857 A1 Jan. 16, 2014

Related U.S. Application Data

(63) Continuation of application No. 13/152,065, filed on Jun. 2, 2011, now Pat. No. 8,557,642.

(51) Int. Cl.
*H01L 29/66* (2006.01)
*B29C 35/02* (2006.01)
*H01L 21/02* (2006.01)
*B29C 35/08* (2006.01)
*H01L 27/12* (2006.01)

(52) U.S. Cl.
CPC ...... *H01L 29/66742* (2013.01); *B29C 35/0266* (2013.01); *B29C 35/0272* (2013.01); *H01L 21/02422* (2013.01); *H01L 21/02439* (2013.01); *H01L 21/02532* (2013.01); *H01L 21/02667* (2013.01); *H01L 21/02686* (2013.01); *H01L 21/02689* (2013.01); *H01L 29/66757* (2013.01); *B29C 35/0805* (2013.01); *B29C 2035/0855* (2013.01); *B29C 2035/0877* (2013.01); *H01L 27/1281* (2013.01)

(58) Field of Classification Search
USPC .................................................. 257/E21.411
See application file for complete search history.

(56) References Cited

U.S. PATENT DOCUMENTS 5,950,078 A * 9/1999 Maekawa et al. ............. 438/149
2007/0037346 A1 * 2/2007 Grant ............................ 438/243
2009/0042343 A1 * 2/2009 Kakkad ........................ 438/166

* cited by examiner

*Primary Examiner* — Charles Garber
*Assistant Examiner* — Stanetta Isaac
(74) *Attorney, Agent, or Firm* — Antony P. Ng; Russell Ng PLLC

(57) ABSTRACT

A method for thermally processing a minimally absorbing thin film in a selective manner is disclosed. Two closely spaced absorbing traces are patterned in thermal contact with the thin film. A pulsed radiant source is used to heat the two absorbing traces, and the thin film is thermally processed via conduction between the two absorbing traces. This method can be utilized to fabricate a thin film transistor (TFT) in which the thin film is a semiconductor and the absorbers are the source and the drain of the TFT.

14 Claims, 5 Drawing Sheets

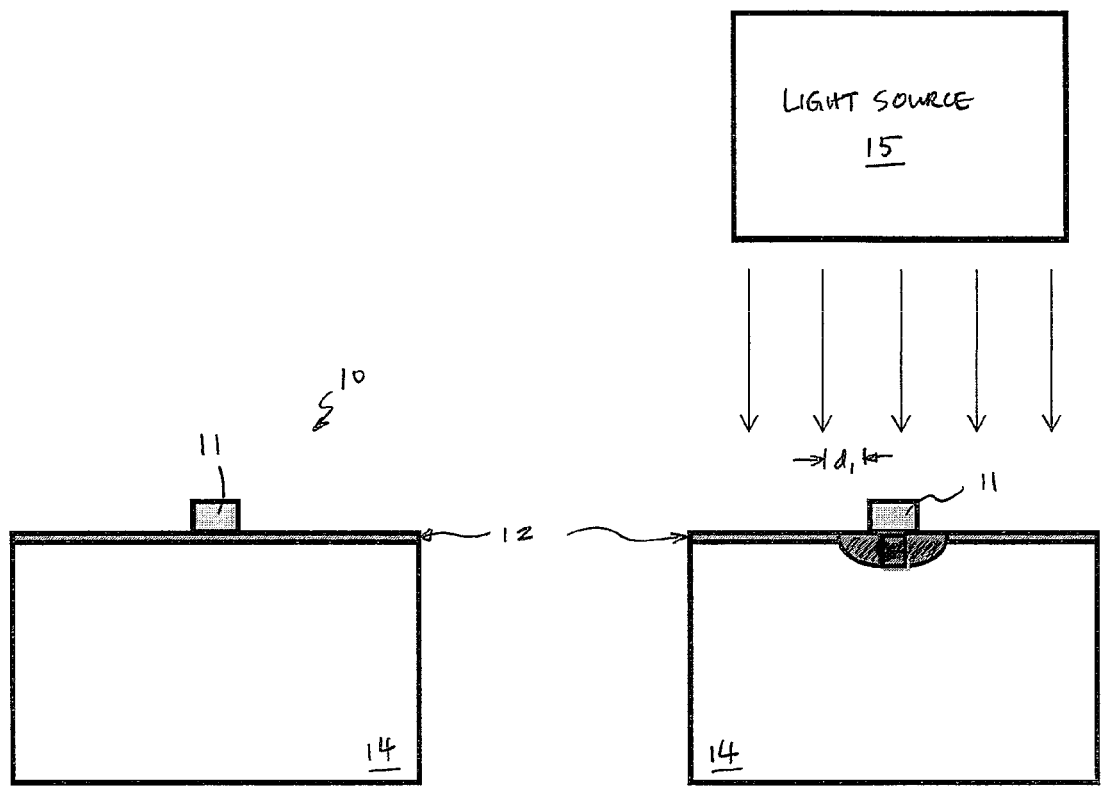
Figure 1a                                Figure 1b

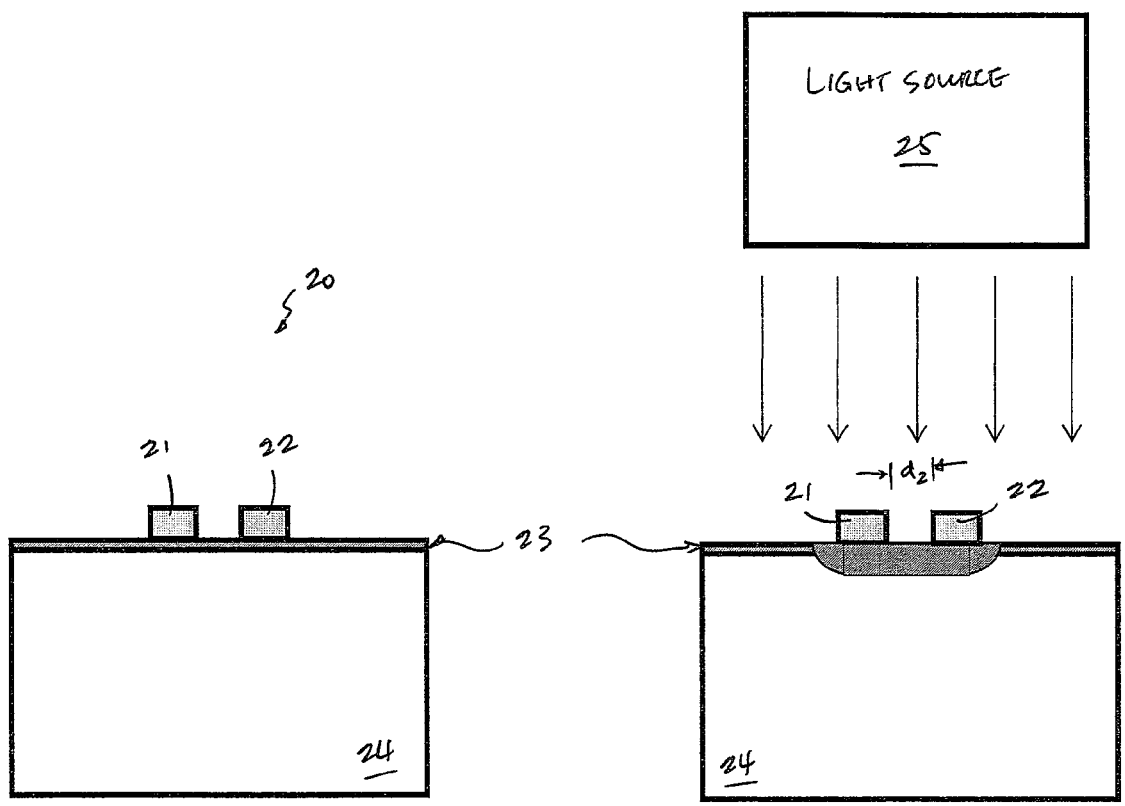
Figure 2a                    Figure 2b

METHOD FOR PROVIDING LATERAL THERMAL PROCESSING OF THIN FILMS ON LOW-TEMPERATURE SUBSTRATES

PRIORITY CLAIM

The present application claims priority under 35 U.S.C. §119(e)(1) to provisional application No. 61/350,765 filed on Jun. 2, 2010 and application Ser. No. 13/152,065 filed on Jun. 2, 2011, the contents of which are incorporated herein by reference.

BACKGROUND OF THE INVENTION

1. Technical Field

The present invention relates to a method for curing thin films on substrates in general, and, in particular, to a method for thermally processing thin films on low-temperature substrates.

2. Description of Related Art

In general, thermal processing encompasses sintering, annealing, curing, drying, crystallization, polymerization, chemical reaction initiation and modulation, dopant drive-in, degasification, etc. Thermal processing of semiconductor thin films is typically performed in high temperature environments. For example, amorphous silicon (a-Si) is annealed at 1,100° C., and silicon nanoparticle films are sintered at 900° C. Thus, the high-temperature requirement for processing semiconductor thin films often mandates the usage of high-temperature substrates, such as fired ceramics or quartz, as the choice substrates for carrying semiconductor thin films.

Needless to say, it is more desirable to use low-temperature substrates, such as borosilicate or soda lime, as the choice substrates for carrying semiconductor thin films if possible because of their relatively low cost. Even more desirable substrate materials would be plastic (i.e., polycarbonate, polyimide, PET, PEN, etc.) or paper because their cost is even lower.

However, the usage of equipment that can provide an equilibrium process, such as an oven, is not a viable option for thermally processing a semiconductor thin film on a low-temperature substrate. This is because the required temperature for annealing and sintering most, if not all, semiconductor thin films are considerably higher than the maximum working temperatures of low-temperature substrates such as polyimide and PET, which are around 450° C. and 150° C., respectively.

The present disclosure provides a method for thermally processing thin films on low-temperature substrates.

SUMMARY OF THE INVENTION

In accordance with a preferred embodiment of the present invention, two absorbing traces spaced apart are in thermal contact with a thin film located on top of a substrate. Pulsed radiation is utilized to heat the two absorbing traces, and the heat from the two absorbing traces is subsequently conducted in the plane of the thin film to the thin film between the two absorbing traces to thermally process the thin film.

The above-mentioned process may be used to fabricate a thin film transistor (TFT). For example, two absorbing traces, which may be composed of metal or ceramic, can be used to form a source and drain of a TFT, and a semiconductor thin film can be used to form an active channel of the TFT.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein:

FIGS. 1a-1b depict a method for thermally processing a thin film, in accordance with one embodiment of the present invention;

FIGS. 2a-2b depict a method for thermally processing a thin film, in accordance with another embodiment of the present invention;

DETAILED DESCRIPTION OF A PREFERRED EMBODIMENT

Figures 3A, 3B:
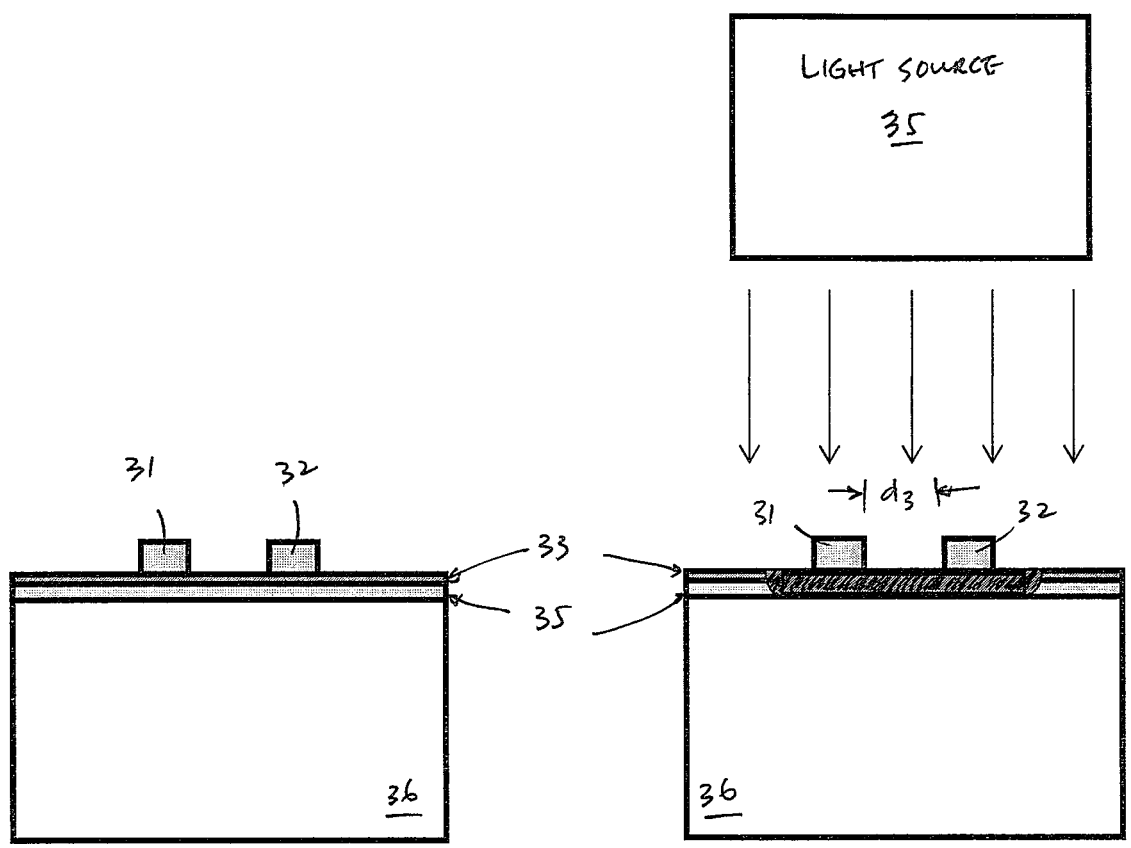
FIGS. 3a-3b depict a method for thermally processing a very thin film on a low-temperature substrate, in accordance with one embodiment of the present invention.

When using a pulsed radiation thermal processing technique to thermally process a thin film on a substrate, the pulsed radiation emitted from flashlamps, directed plasma arcs (DPAs), lasers, microwaves, induction heaters or electron beams has the ability to preferentially heat the thin film over its substrate. In addition, because the heat capacity of the substrate is much larger than that of the thin film, and the time of heating is much shorter than the thermal equilibration time of the substrate, the substrate can serve as a heat sink to rapidly cool the thin film immediately after thermal processing.

Although pulsed radiation thermal processing allows a thin film to be heated to a much higher temperature than its substrate can normally withstand at thermal equilibrium, such thermal processing technique generally depends on the ability of a thin film to absorb the radiation that is used to heat the thin film. Thus, when a thin film is very thin and/or somewhat transparent, it is quite difficult to thermally process the very thin film directly with the pulsed radiation thermal processing technique because the very thin film typically absorbs minimal radiation. Consequently, an improved method is required to thermally process a very thin film.

Referring now to the drawings, and in particular to FIGS. 1a-1b, there are depicted a method for providing pulsed radiation thermal processing on a very thin film, in accordance with one embodiment of the present invention. Initially, a very thin film 12 is deposited on a substrate 14 via well-known vacuum techniques. Very thin film 12 may also be coated or printed on substrate 14. Very thin film 12 can be a fully dense film or a particulate film. The thickness of very thin film 12 is preferably less than 10 microns. Next, an absorbing trace 11 is deposited on top of very thin film 12 to form a thin film stack 10, as shown in FIG. 1a. Absorbing trace 11 is preferably made of a material that is more absorptive of pulsed radiation than very thin film 12. Examples of absorbing trace 11 include metals or ceramics.

When thin film stack 10 is transiently irradiated (i.e., via pulsed radiation) by a light source 15, absorbing trace 11 is preferentially heated before very thin film 12. Light source 15 can be a flashlamp, directed plasma arc (DPA), laser, microwave generator, induction heater or electron beam. As a result, the area (shaded area) within very thin film 12 and substrate 14 located underneath and adjacent to absorbing trace 11 is thermally processed by the heated absorbing trace 11, as shown in FIG. 1b. The distance $d_1$ within very thin film 12 that is thermally processed can be tens of microns.

With reference now to FIGS. 2a-2b, there are illustrated a method for providing pulsed radiation thermal processing on a very thin film, in accordance with another embodiment of the present invention. Initially, a very thin film 23 is deposited on a substrate 24 via well-known vacuum techniques. Very thin film 23 can also be coated or printed on substrate 24. Very thin film 23 can be a fully dense film or a particulate film. The thickness of very thin film 23 is preferably less than 10 microns. Next, absorbing traces 21, 22 are deposited on very thin film 23 to form a thin film stack 20, as shown in FIG. 2a. Similar to absorbing trace 11 in FIG. 1a, absorbing traces 21, 22 are preferably made of a material that is more absorptive of pulsed radiation than very thin film 23. Examples of absorbing traces 21, 22 include metals or ceramics. Although absorbing traces 21, 22 are shown to be formed on top of very thin film 23, absorbing traces 21, 22 can be formed underneath very thin film 23 instead.

Upon being exposed to pulsed radiation from a light source 25, absorbing traces 21, 22 are preferentially heated over very thin film 23. The heat from absorbing traces 21, 22 is then conducted to the area of very thin film 23 underneath and/or adjacent to absorbing traces 21, 22, as shown in FIG. 2b. In FIG. 2b, an area $d_2$ within very thin film 23 located between absorbing traces 21, 22 becomes thermally processed. The gap distance that can be thermally processed between absorbing traces 21 and 22 (i.e., area $d_2$) is generally larger than $d_1$ from FIG. 1b since it is the overlap of the heat being conducted by two absorbing traces 21, 22 and is preferably less than 100 microns. Furthermore, since the area within very thin film 23 located between absorbing traces 21 and 22 is thermally processed by the overlapping of heat being conducted from two absorbing traces 21, 22, very thin film 23 tends to be more uniformly processed than the area of a thin film adjacent to only one absorbing trace (such as in FIG. 1b).

Substrate 14 in FIGS. 1a-1b and substrate 24 in FIGS. 2a-2b are preferably high-temperature substrates. However, thermal processing of very thin films can also be performed on low-temperature substrates (i.e., maximum working temperatures of 150° C. or less) by applying heat spreading films before or after the application of the absorbing traces. Since the thermal conductivity of the heat spreading film is higher than that of the low temperature substrate, heat is preferentially conducted in the plane of the very thin film and the heat spreading film instead of the low temperature substrate after absorbing traces have been heated. The heat spreading film also acts as a thermal barrier layer to protect the low temperature substrate. In addition, the preferential conduction of heat in the plane of the very thin film increases the distance at which absorbing traces can be placed from each other. As a result, a lower energy light pulse can be used to process the very thin film, thus making the process more gentle on the low-temperature substrate. The heat spreading film is generally thicker than the very thin film and is generally transparent to the light used to heat the absorbing traces.

Referring now to FIGS. 3a-3b, there are illustrated a method for thermally processing a very thin film on a low-temperature substrate, in accordance with one embodiment of the present invention. Initially, a heat spreading film 35 is deposited on a substrate 34 via well-known vacuum techniques. Heat spreading film 35 may be coated or printed on substrate 34. A very thin film 33 is then deposited on top of heat spreading film 35 via well-known vacuum techniques. Very thin film 33 may be coated or printed on heat spreading film 35. Very thin film 33 can be a fully dense film or a particulate film. The thickness of very thin film 33 is preferably less than 10 microns. Next, absorbing traces 31, 32 are deposited on very thin film 33 to form a thin film stack 30, as shown in FIG. 3a. Similar to absorbing traces 21, 22 in FIG. 2a, absorbing traces 31, 32 are preferably made of a material that is more absorptive of pulsed radiation than very thin film 33. Examples of absorbing traces 31, 32 include metals or ceramics.

Although absorbing traces 31, 32 are shown to be formed on top of very thin film 33, absorbing traces 31, 32 can be formed underneath very thin film 33. Although heat spreading film 35 is shown to be formed underneath very thin film 33, heat spreading film 35 can be formed on top of very thin film 33 or absorbing traces 31, 32.

Upon being exposed to pulsed radiation from a light source 35, absorbing traces 31, 32 are preferentially heated over very thin film 33 and heat spreading film 35. The heat from absorbing traces 31, 32 is then conducted to the area of very thin film 33 and heat spreading film 35 underneath and/or adjacent to absorbing traces 31, 32, as shown in FIG. 3b. In FIG. 3b, an area $d_3$ within very thin film 33 and heat spreading film 35 located between absorbing traces 31, 32 becomes thermally processed. The gap distance that can be thermally processed between absorbing traces 31 and 32 is preferably less than 100 microns.

There is a host of materials suitable for being heat spreading film 35. For a low-temperature substrate such as PET, those materials may include high-temperature polymers (such as polyimide) or inorganic coatings such as sputtered metal oxides or spin on glass (SOG). For higher-temperature substrates such as polyimide, more suitable materials for heat spreading film 35 include inorganic coatings such as sputtered metal oxides or SOG. It is preferable that heat spreading film 35 be somewhat transparent in order to maintain transparency of the very thin film and still allow the selective heating to occur. The required thickness of heat spreading film 35 is a function of its thermal properties, the thickness and thermal properties of the underlying low temperature substrate, the desired processing temperature of very thin film 33, the dimensions and spacing of absorbing traces 31, 32, and the input radiant heating profile.

One approach of applying a heat spreading film to a high-temperature substrate is to first apply a polymeric coating, which has lower thermal conductivity than the high-temperature substrate, to the high-temperature substrate followed by the application of a heat spreading film. This practice retards the diffusion of heat into the thermally conductive substrate and allows a very thin film to be processed. An alternative to the polymeric coating is to use a high-temperature, low-thermal conductivity inorganic film so that it can withstand a higher temperature during thermal processing.

One method to achieve a high-temperature, low-thermal conductivity inorganic film is to make the inorganic film porous by using a SOG and load it with porous particles. For example, such an inorganic film can be made by using silica aerogel nanoparticles loaded in a SOG. The resulting inorganic film appears to have a thermal conductivity of the order of (or even lower than that of) PET (i.e., 0.24 W/m-° K.). Since the aerogel particles have the SOG matrix, the inorganic film is much more durable than a typical aerogel film.

The thermal processing of the very thin film can be tuned by varying the power and length of the pulsed radiation. Multiple pulses can be used as well as adjusting the pulse repetition frequency. The shape of the pulse can be changed using pulse width modulation to further adjust the heating profile. When the pulse length is shorter than the thermal equilibration time of the low-temperature substrate, that is, perpendicular to the plane of the low-temperature substrate, a stronger thermal gradient and higher peak temperature can be generated in it, thereby preferentially heating the very thin film adjacent to the absorbing traces. The temperature in the very thin film is more intensely processed near the absorbing traces relative to regions farther away from the absorbing traces. Furthermore, pulsed radiation allows the peak processing temperature to be greater than the maximum equilibrium working temperature of a substrate. For example, 150 micron thick PET thermally equilibrates across its thickness in about 35 ms. Thus, a stronger thermal processing gradient as well as a higher peak temperature can be produced without damaging the low-temperature substrate with a 300 μs pulse than with a 10 ms pulse. A 100 ms pulse can still heat the very thin film located between the absorbing traces, but the peak temperature that can be maintained is very close to its maximum equilibrium working temperature of 150° C. In sum, the maximum peak temperature that can be achieved in the very thin film without damaging the low-temperature substrate of a longer pulse is less than that of a short pulse, but the lateral processing length is correspondingly longer also. Since the thermal processing of the very thin film is usually Arrhenius in nature, i.e., the thermal processing is generally related to the exponential of the processing temperature times time, a shorter pulse can process the very thin film more effectively than a longer pulse without damaging the low-temperature substrate.

The thickness, width, and spacing of absorbing traces as well as the thickness and thermal properties of a very thin film and underlying layers also contribute to the heating profile seen by the very thin film upon being exposed by pulsed radiation.

The method of the present invention can process very thin films that are not particularly radiation absorbing. This is particularly relevant to the fabrication of thin film transistors (TFTs) that are very desirable because of their low cost and high performance.

Figure 4:
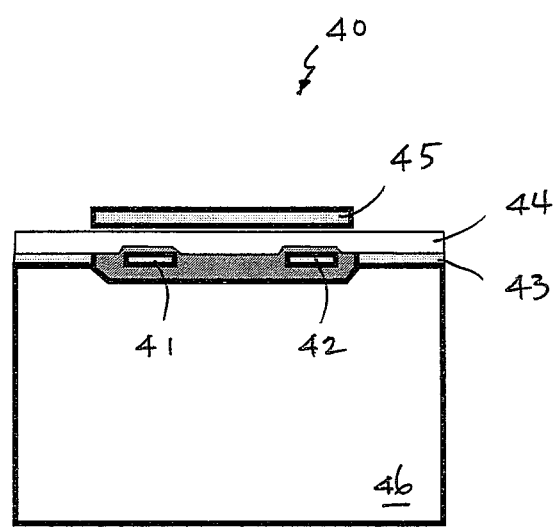
FIG. 4 shows a thin film transistor (TFT) manufactured by the methods of the present invention.

Referring now to FIG. 4, there is depicted a TFT 40 manufactured by the above-mentioned pulsed radiation thermal processing technique. As shown, a thin dielectric layer 44 is placed on top of two absorbing traces 41 and 42 that are located adjacent to a very thin film 43. A conductive trace 45 is located on top of dielectric layer 44 and absorbing traces 41 and 42. Absorbing traces 41, 42 are electrically conductive and form the source and the drain of a TFT, respectively. Conductive trace 45 forms the gate of the TFT. The area located between absorbing traces 41 and 42 within very thin film 43 that has been thermally processed is a semiconductor forms the active channel of the TFT. As shown in FIG. 4, the cured area (shaded area) includes the gate oxide and the gate. However, both the gate oxide and the gate are applied after the curing of the very thin film 43.

Very thin film 43 is cured primarily between absorbing traces 41 and 42. Thus, sources and drains can be patterned (or printed) on a very large area, and very thin film 43 can even be coated over an entire substrate 46. Since a cured semiconductor generally has a higher conductivity than an uncured one, the fact that the semiconductor becomes cured primarily in the channel of the TFT, the parasitic capacitance of the semiconductor is reduced. The reduced need for registration and critical dimensions means that the above-mentioned TFT can be completely printed en mass.

An example of a method for making a TFT, such as TFT 40, is described as follows. When making a TFT, microcrystalline silicon (μx-Si) is more desirable as a semiconductor than amorphous silicon (a-Si) because μx-Si has higher mobility and therefore enables a faster switching TFT. It is usually easier to deposit a-Si followed by a thermal anneal to convert a-Si to μx-Si than to deposit μx-Si directly. For example, a 200 nm film of a-Si on a 500 μm borosilicate wafer can be converted to μx-Si (with an N2 purge) by using a light pulse from a PulseForge® 3300 system (manufactured by NovaCentrix in Austin, Tex.) at a threshold voltage of 650 V and a pulse length of 100 μs. The light pulse has an intensity of about 35 kW/cm$^2$, which corresponds to a radiant exposure of about 3.5 J/cm$^2$.

Figure 5:
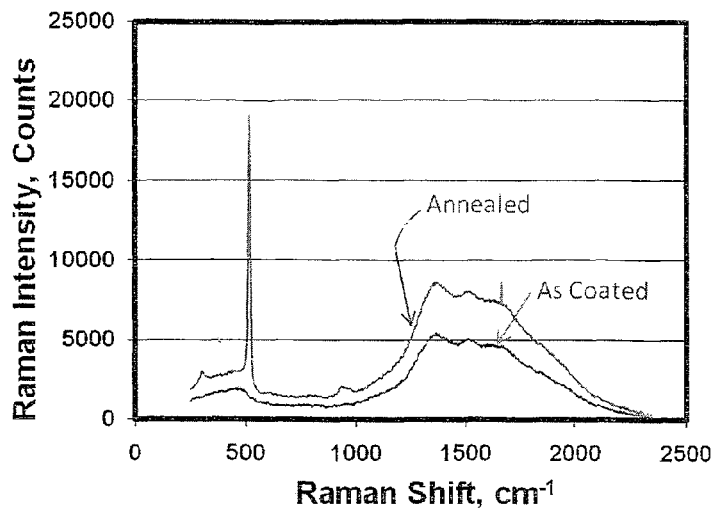
FIG. 5 shows a Raman spectrum of an e-beam coated amorphous silicon on a borosilicate glass before and after being exposed to pulsed radiation.

With reference now to FIG. 5, there is illustrated a Raman spectrum of 200 nm a-Si film that was e-beam sputtered coated on a borosilicate glass before and after being exposed to the above-mentioned light pulse. The a-Si film is annealed by the light pulse and is converted to μx-Si. The light pulse is needed to overcome the fact that a 200 nm a-Si coating only absorbs a portion of the emitted light.

An identical borosilicate wafer is patterned with gold contact source/drain lines to form an eventual TFT of various widths (5-50 μm) and separations (5-50 μm). All traces are 5 mm long. The gold patterning is followed by an identical broadcast electron beam sputtered deposition of 200 nm of a-Si described above over the borosilicate wafer. The borosilicate wafer is then processed via the above-mentioned PulseForge® 3300 system at a much lower voltage (i.e., 550 V for 250 μs). The radiant power was 24 kW/cm$^2$, and the radiant exposure was 5.9 J/cm$^2$. Note that this level of power is below the threshold intensity described above for converting a-Si to μx-Si. Since gold is very absorbing of the light pulse, more energy is absorbed at those locations.

Figure 6:
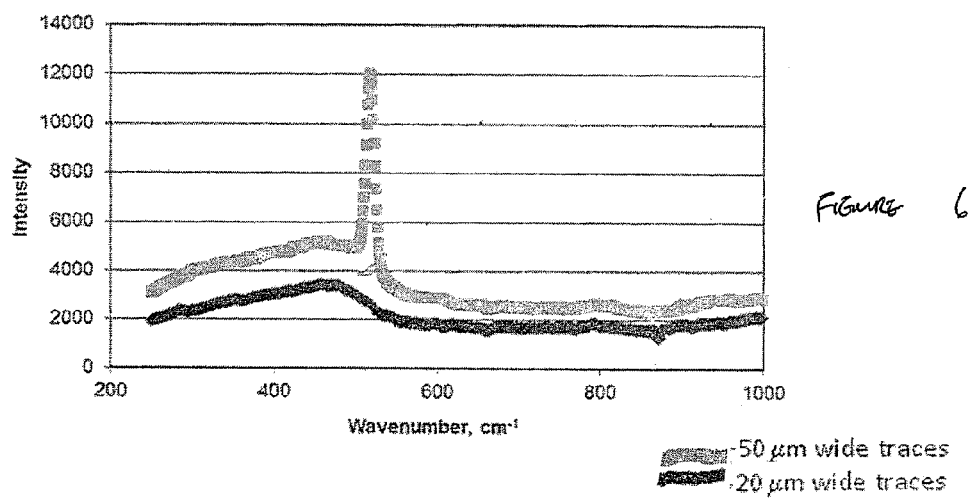
FIG. 6 is a graph showing the selectivity of the pulsed radiation lateral thermal processing method of the present invention.

Referring now to FIG. 6, there is illustrated the selectivity of the pulsed radiation thermal processing method of the present invention. The graph shows a comparison of the Ramen spectrum of the thin silicon film between two different gold line pair widths (50 μm and 20 μm) and identical spacing (50 μm) between the gold traces. The graph shows that the space between the 50 μm traces has been converted to μx-Si, whereas the space between the 20 μm wide traces is unconverted. Similarly, the silicon film on the rest of the wafer is unconverted. This technique has converted the a-Si to μx-Si only between the gold patterned traces and nowhere else achieving automatic registration.

After selective conversion of a-Si to μx-Si between the absorbing traces has been achieved, a TFT device can be fabricated using a spin-on barium-strontium-titanate (BST) ceramic as the dielectric layer. This dielectric material has a relatively high dielectric constant k (~300), which allows a high electric field to be imparted to the field-effect channel of the TFT at low gate voltage. A silver gate metal is vacuum deposited onto the BST gate dielectric layer to complete the TFT.

Electrical testings can be performed on the TFT to determine if the drain current can be enhanced by applying a positive gate voltage. Since μx-Si is slightly n-type, a positive gate voltage should enhance the electron concentration in the channel and result in an increased drain current ($I_d$).

Figure 7:
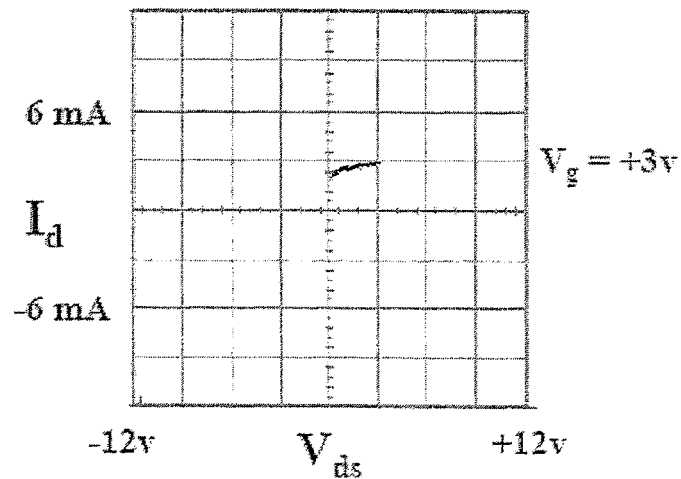
FIG. 7 is a graph showing drain current versus drain-source voltage for the TFT from FIG. 4.

With reference now to FIG. 7, there is illustrated a graph showing drain current ($I_d$) versus drain-source voltage ($V_{ds}$) for TFT 40 from FIG. 4. Note that at positive gate voltage ($V_g$), the drain current ($I_d$) is enhanced and has the saturation shape one expects for a field-effect TFT. The linear I-V characteristic observed at negative gate voltage indicates TFT 40 is behaving as a regular resistor when the negative gate voltage is applied. Reasons for this are unknown at this time but may be due to hole injection from the source and drain contacts. This effect, if present, is normally reduced/eliminated by suitably doping the contact regions in order to "block" hole injection.

In summary, using pulsed light annealing of an a-Si thin film with laterally positioned metal source-drain contacts can be "sub-threshold" annealed to a microcrystalline state within the region between the source-drain contacts. This has great benefit for the microelectronics industry since micro (and nano)-crystalline silicon films have high carrier mobility and other desirable features that enhance the performance of thin film devices. Furthermore, since one can convert only the a-Si in the region between source/drain contacts, leaving the surrounding regions of the a-Si to remain in a high-resistance amorphous state, and thus not require patterning or otherwise isolation to limit such deleterious effects as parasitic capacitances which limit device speed and increase power dissipation.

As has been described, the present invention provides a method for thermally processing thin films on low-temperature substrates. The method of the present invention also enables a TFT to be manufactured in a top gate configuration (i.e., gate on top) with minimal registration. Two absorbing traces form a source and drain of a TFT. Before the application of the gate oxide and the gate, the thin film material is preferentially thermally processed between the two absorbing traces. The method of the present invention has the effect of selectively curing the thin film material without the need to precisely deposit the material in the channel of the TFT.

While the invention has been particularly shown and described with reference to a preferred embodiment, it will be understood by those skilled in the art that various changes in form and detail may be made therein without departing from the spirit and scope of the invention.

What is claimed is:

1. A method for thermally processing a very thin film, said method comprising:
    patterning two absorbing traces adjacent to a very thin film, wherein said two absorbing traces are made of metal, wherein said thin film is located on top of a substrate;
    irradiating said two absorbing traces with at least one electromagnetic pulse to heat up said two absorbing traces, wherein a pulse length of said at least one electromagnetic pulse is shorter than a thermal equilibration time of said substrate; and
    allowing heat from said two absorbing traces to thermally process said very thin film.

2. The method of claim 1, wherein said substrate has a maximum working temperature of less than 450° C.

3. The method of claim 1, wherein said two absorbing traces are made of materials more absorptive of said electromagnetic pulse than said very thin film.

4. The method of claim 1, wherein said method further includes providing a heat spreading layer adjacent to said very thin film.

5. The method of claim 4, wherein said method further includes providing a high temperature, low-thermal conductivity film between said heat spreading layer and said substrate.

6. The method of claim 1, wherein said electromagnetic pulse is provided by a flashlamp.

7. The method of claim 1, wherein said electromagnetic pulse is provided by a directed plasma arc.

8. A method for fabricating a thin film transistor, said method comprising:
    patterning two absorbing traces adjacent to a very thin film, wherein said two absorbing traces are made of metal, wherein said thin film is located on top of a substrate;
    irradiating said two absorbing traces with at least one electromagnetic pulse to heat up said two absorbing traces, wherein a pulse length of said at least one electromagnetic pulse is shorter than a thermal equilibration time of said substrate, and allowing heat from said two absorbing traces to thermally process said very thin film;
    depositing a dielectric layer on said two absorbing trace and said very thin film; and
    forming a gate by depositing a conductive trace on top of said dielectric layer.

9. The method of claim 8, wherein said substrate has a maximum working temperature of less than 450° C.

10. The method of claim 8, wherein said two absorbing traces are made of materials more absorptive of said electromagnetic pulse than said very thin film.

11. The method of claim 8, wherein said method further includes providing a heat spreading layer adjacent to said very thin film.

12. The method of claim 11, wherein said method further includes providing a high-temperature, low-thermal conductivity film between said heat spreading layer and said substrate.

13. The method of claim 8, wherein said electromagnetic pulse is provided by a flashlamp.

14. The method of claim 8, wherein said electromagnetic pulse is provided by a directed plasma arc.

* * * * *